(12) United States Patent
Hermann

(10) Patent No.: US 6,587,532 B1
(45) Date of Patent: Jul. 1, 2003

(54) METHOD OF GENERATING A CLOCK SIGNAL IN A MODULE OF A DATA TRANSMISSION SYSTEM, AND CORRESPONDINGLY EQUIPPED DATA TRANSMISSION SYSTEM

(75) Inventor: Stefan Hermann, Köfering (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/161,199

(22) Filed: Sep. 24, 1998

(30) Foreign Application Priority Data

Sep. 24, 1997 (DE) .......................................... 197 42 170

(51) Int. Cl.7 ................................................ H03D 3/24
(52) U.S. Cl. ..................................................... 375/376
(58) Field of Search ................................ 375/356, 358, 375/359, 376, 373, 327, 215, 219; 332/127; 329/325, 307, 304; 331/21, 25, 55; 327/37, 2, 141, 147, 144; 455/260, 265, 73

(56) References Cited

U.S. PATENT DOCUMENTS

| | | | |
|---|---|---|---|
| 5,027,085 A | | 6/1991 | DeVito |
| 5,812,594 A | * | 9/1998 | Rakib ......................... 375/219 |
| 5,838,667 A | * | 11/1998 | Bingham et al. ........... 370/294 |
| 5,864,592 A | * | 1/1999 | Itri ............................. 375/220 |
| 5,889,824 A | * | 3/1999 | Ueda .......................... 375/326 |
| 5,930,729 A | * | 7/1999 | Khamis et al. ............. 455/11.1 |
| 5,937,020 A | * | 8/1999 | Hase et al. .................. 327/141 |
| 5,940,411 A | * | 8/1999 | Takeda ....................... 714/701 |
| 5,950,115 A | * | 9/1999 | Momtaz et al. ............. 327/147 |
| 6,125,139 A | * | 9/2000 | Hendrickson et al. ...... 375/220 |
| 6,219,380 B1 | * | 4/2001 | Wang et al. ................. 329/313 |

FOREIGN PATENT DOCUMENTS

DE      44 27 972 C1      7/1995

* cited by examiner

*Primary Examiner*—Emmanuel Bayard
(74) *Attorney, Agent, or Firm*—Laurence A. Greenberg; Werner H. Stemer; Ralph E. Locher

(57) ABSTRACT

The invention relates to a method for generating the working clock in a module of a data transmission system. The system is particularly suitable for use in a vehicle occupant protection system of a motor vehicle. A control unit of the data transmission system transmits a synchronization clock signal to the module. The module contains a frequency-locked and/or phase-locked loop which receives the synchronization clock signal and which generates the module working clock on the basis of the synchronization clock signal.

12 Claims, 1 Drawing Sheet

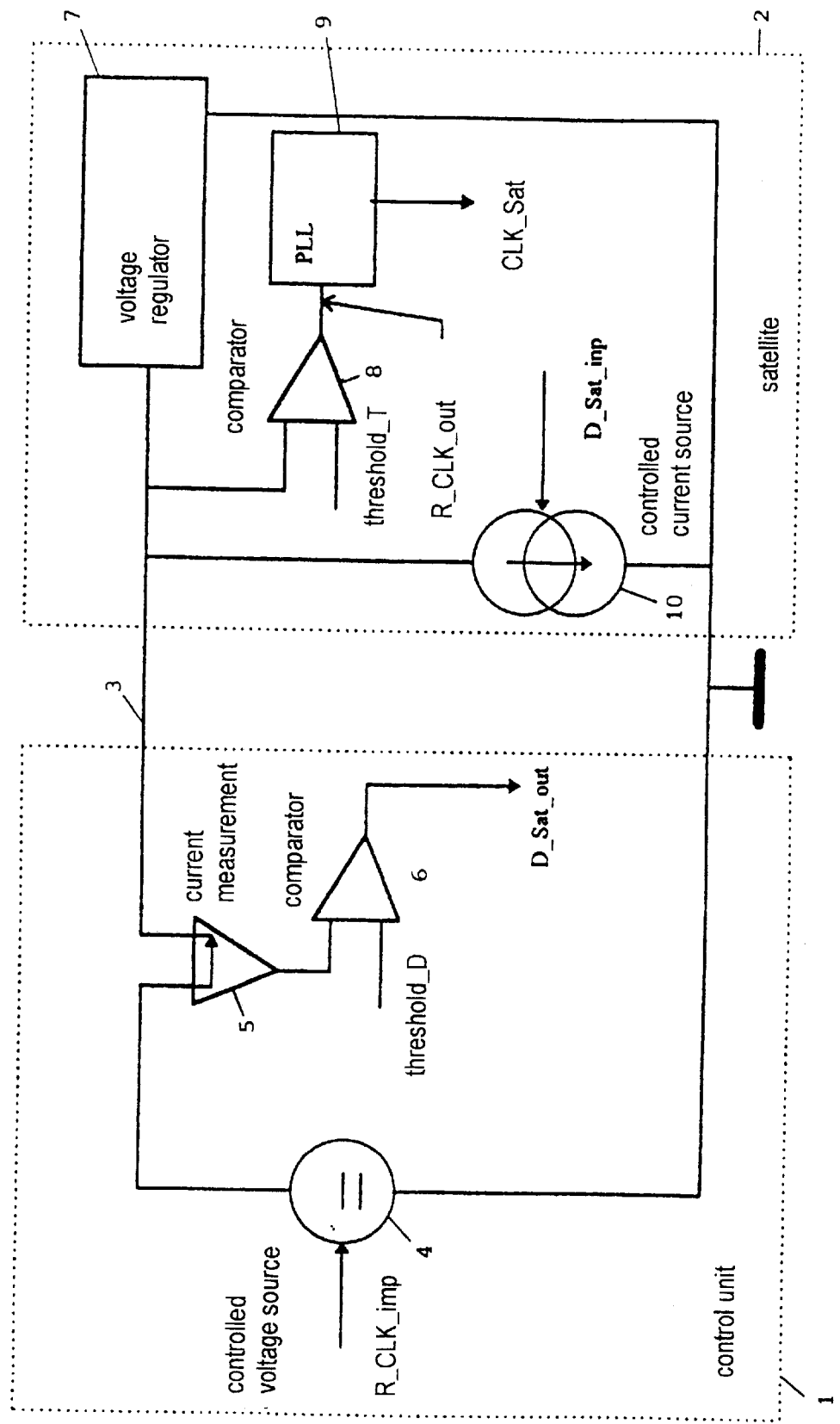

METHOD OF GENERATING A CLOCK SIGNAL IN A MODULE OF A DATA TRANSMISSION SYSTEM, AND CORRESPONDINGLY EQUIPPED DATA TRANSMISSION SYSTEM

BACKGROUND OF THE INVENTION

Field of the Invention

The invention relates to a method for generating the working clock in a module of a data transmission system, in particular in a vehicle occupant protection system of a motor vehicle, and to a corresponding data transmission system with a control unit and one or more modules connected to the control unit via a data transmission line.

Customarily, in methods of the generic type the working clock signal is generated in the module by means of a separate resonator, for example a ceramic resonator in the module. Vehicle occupant protection systems, such as airbag control units often have, in this context, a central control unit (ECU) and externally located modules (satellites) containing acceleration sensors. The externally located modules signal, for example, the accelerations in the case of a side impact or they generate accident early-detection information.

The central control unit is also equipped with a separate time base in the form of a resonator. The externally located modules frequently transmit detection signals to the central control unit in a defined pattern in order to signal their correct active operating state to the central control unit. However, the transmission pattern is dependent on the separate time base of the satellite which is generated by the resonator, with the result that the communication runs asynchronously and is therefore susceptible to faults. Also, the time base used in the satellite must have a high degree of precision in order to ensure the correct digital signal processing in the module. Accordingly, the satellite time base thus provided is technically complex.

In addition, it is important that the working clock of the module or modules and the working clock of the central control unit correspond. If the clocks are not exactly synchronized, errors, in particular aliasing errors, may occur in the evaluation of the acceleration signals measured by the module and transmitted to the central control unit. The result is that the frequency of the actually measured acceleration signals may differ from the frequency, determined in the control unit, of the control signals after their evaluation. These incorrect evaluations can, for example, lead to the undesired, unnecessary initiation of protective measures, and are therefore critical.

SUMMARY OF THE INVENTION

It is accordingly an object of the invention to provide a method of producing a working clock in the module of a data transmission system and a correspondingly equipped data transmission system, which overcome the above-mentioned disadvantages of the heretofore-known devices and methods of this general type and which allows generating the working clock in the module with little outlay.

With the foregoing and other objects in view there is provided, in accordance with the invention, a method of generating a working clock in a module of a data transmission system, particularly for a vehicle occupant protection system in a motor vehicle, which comprises:

transmitting, with a control unit of a data transmission system, a synchronization clock signal to a module of the data transmission system;

receiving the synchronization clock signal with a frequency-locked and/or phase-locked loop in the module;

generating, with the frequency-locked and/or phase-locked loop a working clock on the basis of the synchronization clock signal; and controlling an operation of the module with the working clock, including transmission and reception processes.

In other words, the control unit generates a synchronization clock signal which is fed to the module and on the basis of which the module generates it own working clock with the aid of a frequency-locked and/or phase-locked loop. Since the use of a frequency-locked and/or phase-locked loop requires in fact very much less outlay than the use of a separate resonator, the generation of the working clock in the module is possible with little technical outlay.

In addition, there is the advantage that the working clock formed in the module is continuously correlated with the synchronization clock signal supplied by the control unit so that synchronous operation of the control unit and the module can be achieved. Thus, a synchronous connection is made possible between the control unit and the module, which connection has a significantly higher transmission speed and transmission reliability in comparison with asynchronous communication.

The frequency-locked and/or phase-locked loop of the module can be formed by a cost-effective circuit which can be completely integrated.

In accordance with an additional feature of the invention, the synchronization clock signal is generated in the control unit in the form of voltage pulses, and the data are transmitted from the module to the control unit in the form of current pulses. The interface between the control unit and the module is thus configured as a bidirectional interface which acts as a voltage interface in the direction from the control unit to the module and operates as a current interface in the direction from the module to the control unit. As a result, it is possible to ensure that the synchronization clock signal which is transmitted from the control unit to the module can be transmitted completely independently of a data transmission which may be made simultaneously in the opposite direction. Between the control unit and the module there is thus a synchronous and bidirectional transmission link which is capable of full duplex operation. The control unit can in this case, of course, not only transmit the synchronization of clock signal to the module but also transmit additional data, for example control data for the purpose of programming the module.

In accordance with another feature of the invention, the synchronization clock signal is a low-frequency signal, and wherein the generating step comprises subjecting the clock signal to a frequency multiplication in the frequency-locked and/or phase-locked loop and forming the working clock. The synchronization clock signal which is transmitted by the control unit preferably has a frequency below 10 kilohertz, for example 1 to 2 kilohertz. On the basis of this synchronization clock signal, the frequency-locked and/or phase-locked loop generates in the module an internal signal which is fixed in terms of frequency and/or phase and which is then multiplied by frequency multiplication to the working clock of the module, for example 10 to 16 megahertz. The use of a low-frequency synchronization clock signal provides the advantage that the loading of the central control unit by the generation of this signal is correspondingly reduced and also a possibly simultaneously occurring, very much higher-frequency data transmission can be distinguished clearly from the synchronization clock signal, i.e. does not cause any disruption to the signal and thus to the frequency stability of the working clock in the module.

It is a further refinement of the invention and the data transmission system according to the invention can be simplified still further by using the data transmission line not only for transmitting data and synchronization clock signals but also at the same time as a voltage supply line for the module. For this reason, the module does not require a separate voltage terminal but rather can be fed with the supply voltage from the control unit without additional outlay on interconnections. In this case, the module is preferably provided with a voltage regulator for generating a constant module supply voltage.

With the above and other objects in view there is also provided, in accordance with the invention, a data transmission system, particularly for a vehicle occupant protection system in a motor vehicle, comprising:

a control unit with a synchronization clock signal generator generating a synchronization clock signal;

a module with a frequency-locked and/or phase-locked loop;

a data transmission line connecting the module to the control unit;

the frequency-locked and/or phase-locked loop of the module receiving the synchronization clock signal generated by the synchronization clock generator of the control unit, and, based on the synchronization clock signal, generates a working clock controlling an operation of the module, including transmission and reception processes of the module.

In accordance with again an added feature of the invention, the frequency-locked and/or phase-locked loop includes a frequency multiplier for frequency-multiplying a signal formed internally from the synchronization clock signal.

In accordance with again an additional feature of the invention, the control unit. is operated at a given working clock, and the synchronization clock generator is a voltage source actuated in dependence on the working clock of the control unit.

In accordance with again another feature of the invention, the module transmits data to the control unit in the form of current pulses, and the control unit includes a current measuring device connected to the data transmission line for detecting and demodulating the data signals supplied by the module.

In accordance with again a further feature of the invention, the module contains a controlled current source for generating the data signals.

In accordance with again another feature of the invention, the frequency-locked and/or phase-locked loop has an input, and the module includes a comparator having an input connected to the data transmission line and an output connected to the input of the frequency-locked and/or phase-locked loop.

In accordance with a concomitant feature of the invention, the control unit impresses a d.c. voltage on the data transmission line, and the module includes a voltage regulator having an input connected to the data transmission line and an output outputting a supply voltage for the module.

The invention can be used not only in vehicle occupant protection systems such as airbag systems or belt-pretensioning systems but also for transmitting data between. control units provided for other purposes and associated externally located circuits, in particular in motor vehicles. In addition, it is also possible to connect to the control unit a plurality of modules whose internal working clock is generated synchronized in each case on the basis of the synchronization clock signal supplied by the central control unit.

Other features which are considered as characteristic for the invention are set forth in the appended claims.

Although the invention is illustrated and described herein as embodied in a method of generating the working clock in a module of a data transmission system, and a correspondingly equipped data transmission system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a schematic circuit diagram of the interface area of an exemplary embodiment of the data transmission system according to the invention.

DESCRIPTION OF THE PREFERRED EMBODIMENTS

The invention is illustrated herein with reference to an exemplary embodiment of the data transmission system in an airbag vehicle occupant protection system. The system has a central control unit 1, which controls the triggering of the non-illustrated airbag or airbags, and one or more externally located modules (satellites) 2. The module 2 contains one or more acceleration sensors for sensing a side impact and/or early detection sensors for the early detection of an accident. The control unit 1 and the module 2 are connected to one another via a data transmission line 3. The data transmission line 3 not only carries the signal for transmitting data but also the voltage supply for the module 2. The transmission line 3 thus conducts an open-circuit voltage impressed by the control unit 1.

The control unit 1 comprises a controlled voltage source 4 which is clocked by a non-illustrated resonator in the control unit 1. The resonator generates the working clock in order to control the mode of operation of the control unit 1, which has, for example, a frequency between 10 and 16 megahertz. In order to control the controlled voltage source 4 the working clock is severely divided down and reduced, for example, to a value between 1 and 2 kilohertz. For this reason, the voltage source 4 generates, on the data transmission line 3, voltage pulses with the corresponding frequency of between 1 and 2 kilohertz and these pulses are applied to the module 2 as a synchronization clock signal. In addition, data signals can be transmitted from the control unit 1 to the module 2 via the data transmission line 3. Those signals are generated in the control unit by components that are not illustrated for purposes of clarity and the signals are fed to the data transmission line 3 in the form of voltage pulses. The module 2 contains a data receiver for the data evaluation. The data receiver, which is also not illustrated for purposes of clarity, responds to the high-frequency voltage pulses and applies corresponding output signals to an evaluation circuit.

In the module 2, a comparator 8 is connected to the data transmission line 3. The comparator compares the synchronization clock signal generated by the control unit 1 with a preset threshold. The output of the comparator 8 is connected to a frequency-locked and/or phase-locked loop, preferably in the form of a PLL circuit 9. The frequency-locked and/or phase-locked loop generates internally an intermediate signal which is coupled, fixed at least in terms of frequency but preferably also in terms of phase, to the output signal of the comparator 8 and thus to the synchronization clock signal. The signal has a frequency which corresponds to the synchronization clock signal (preferably 1 to 2 kHz). The intermediate signal is converted, by means of internal frequency multipliers, to the working clock of, for example, 10 to 16 MHz required by the module 2. This module working clock is emitted at the output of the PLL circuit 9 and applied as a working clock to the microprocessor or microcontroller in the module 2. Since the working clock of the module 2 is generated strictly on the basis of the synchronization clock signal of the control unit, and the synchronization clock signal itself is generated strictly on the basis of the resonator working clock of the control unit 1, the invention ensures a very good synchronization between the working clocks of the microprocessors or microcontrollers of the control unit 1 and of the module 2. As a result, there is inevitably also synchronous operation during the transmission and reception of data so that a high degree of reliability and speed of the data transmission can be achieved.

The PLL circuit 9 can be integrated completely and manufactured cost-effectively so that a good degree of synchronization is achieved with little technical outlay and without a separate module resonator.

In order to transmit data to the control unit 1, the module 2 has a controlled current source 10 which is controlled by a data transmission signal applied to the control input of the source 10 and which applies corresponding current pulses to the data transmission line 3. These impressed currents flow to the control unit 1 virtually independently of its voltage at a given time and are converted by a current measuring circuit 5 at the unit 1 into corresponding voltage signals which are applied to a comparator 6. The comparator 6 compares the input-side voltage pulses with a fixed threshold value (threshold_D) and emits at its output an output signal (D_Sat_out) which corresponds to the transmitted data and which is applied to an evaluation circuit of the control unit 1. As a result, the transmission of data from the module 2 to the control unit 1 takes place independently of the synchronization clock signal which is generated by the controlled voltage source 4 and which is made available as a voltage pulse with impressed voltage. The voltage (synchronization clock signal) generated by the voltage source is thus also independent of the current flowing in the module 2 at a given time.

In addition, the central unit 1 impresses a d.c. voltage on the data transmission line 3 and the voltage is applied to a voltage regulator 7 in the module 2. The voltage regulator 7 generates from the input-side d.c. voltage a d.c. supply voltage which is regulated so as to be constant and is used to feed the components and loads in the module 2. As a result, no separate external voltage supply line is necessary for the module 2, which reduces the overall outlay required on interconnections and leads.

I claim:

1. A method of generating a working clock in a module of a data transmission system, which comprises:
   generating a synchronization clock signal in a control unit of the data transmission system in the form of voltage pulses;
   transmitting, with the control unit, the synchronization clock signal to the module of the data transmission system via a bidirectional interface;
   receiving the synchronization clock signal with a frequency-locked and/or phase-locked loop in the module;
   generating, with the frequency-locked and/or phase-locked loop a working clock on basis of the synchronization clock signal;
   controlling an operation of the module with the working clock; and
   transmitting data from the module to the control unit in the form of current pulses via the bidirectional interface.

2. The method according to claim 1, wherein the controlling step comprises controlling transmission and reception processes with the working clock.

3. The method according to claim 1, wherein the control unit and the module are components of a vehicle occupant protection system in a motor vehicle.

4. The method according to claim 1, wherein the synchronization clock signal is a low-frequency signal, and wherein the generating step comprises subjecting the clock signal to a frequency multiplication in the frequency-locked and/or phase-locked loop and forming the working clock.

5. A data transmission system, comprising:
   a control unit with a synchronization clock signal generator generating a synchronization clock signal;
   a module with a frequency-locked and/or phase-locked loop;
   a data transmission line connecting said module to said control unit, said data transmission line being a bidirectional interface acting as a voltage interface in a direction from said control unit to said module for transmitting the synchronization clock signal from said control unit to said module, and acting as a current interface in a direction from said module to said control unit for transmitting data from said module to said control unit; and
   said frequency-locked and/or phase-locked loop of said module receiving the synchronization clock signal generated by said synchronization clock generator of said control unit, and, based on the synchronization clock signal, generates a working clock controlling an operation of the module, including transmission and reception processes of said module.

6. The data transmission system according to claim 5, wherein said control unit and said module are integral components of a vehicle occupant protection system in a motor vehicle.

7. The data transmission system according to claim 5, wherein said frequency-locked and/or phase-locked loop includes a frequency multiplier for frequency-multiplying a signal formed internally from the synchronization clock signal.

8. The data transmission system according to claim 5, wherein said control unit is operated at a given working clock, and said synchronization clock generator is a voltage source actuated in dependence on the working clock of said control unit.

9. The data transmission system according to claim 5, wherein said module transmits data to said control unit in the form of current pulses, and said control unit includes a current measuring device connected to said data transmission line for detecting and demodulating the data signals supplied by said module.

10. The data transmission system according to claim 9, wherein said module contains a controlled current source for generating the data signals.

11. The data transmission system according to claim 5, wherein said frequency-locked and/or phase-locked loop has an input, and said module includes a comparator having an input connected to said data transmission line and an output connected to said input of said frequency-locked and/or phase-locked loop.

12. The data transmission system according to claim 5, wherein said control unit impresses a d.c. voltage on said data transmission line, and said module includes a voltage regulator having an input connected to said data transmission line and an output outputting a supply voltage for said module.

* * * * *